(12) United States Patent
Kittl et al.

(10) Patent No.: US 9,698,234 B2
(45) Date of Patent: Jul. 4, 2017

(54) INTERFACE LAYER FOR GATE STACK USING O₃ POST TREATMENT

(71) Applicant: Samsung Electronics Co., Ltd., Gyeonggi-do (KR)

(72) Inventors: Jorge A. Kittl, Round Rock, TX (US); Mark S. Rodder, Dallas, TX (US); Wei-E Wang, Austin, TX (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/666,770

(22) Filed: Mar. 24, 2015

(65) Prior Publication Data

US 2016/0042956 A1    Feb. 11, 2016

Related U.S. Application Data

(60) Provisional application No. 62/034,900, filed on Aug. 8, 2014.

(51) Int. Cl.
| | |
|---|---|
| H01L 21/31 | (2006.01) |
| H01L 31/113 | (2006.01) |
| H01L 29/51 | (2006.01) |
| H01L 21/28 | (2006.01) |
| H01L 29/778 | (2006.01) |

(52) U.S. Cl.
CPC ...... *H01L 29/513* (2013.01); *H01L 21/28185* (2013.01); *H01L 21/28194* (2013.01); *H01L 29/517* (2013.01); *H01L 29/778* (2013.01)

(58) Field of Classification Search
CPC .............. H01L 28/91; H01L 21/3141; H01L 21/28185; H01L 21/31645; H01L 21/76801; H01L 21/02337; H01L 21/0234; H01L 21/32136; H01L 21/02181; H01L 2924/1306; H01L 21/02356; H01L 21/324; H01L 28/09
USPC .............. 438/308, 471, 778, 762, 765, 770; 257/229, 325, 410, 501, 506
See application file for complete search history.

(56) References Cited

U.S. PATENT DOCUMENTS

| | | | |
|---|---|---|---|
| 6,903,407 B1 * | 6/2005 | Kang ................ | H01L 21/28282 257/314 |
| 6,974,779 B2 * | 12/2005 | O'Meara ........... | H01L 21/02181 257/E21.267 |
| 7,396,777 B2 | 7/2008 | Jung | |
| 8,470,659 B2 | 6/2013 | Yao | |
| 8,580,698 B2 | 11/2013 | Lee | |
| 8,603,924 B2 | 12/2013 | Yao | |
| 8,653,516 B1 | 2/2014 | Nelson | |

(Continued)

*Primary Examiner* — Hsien Ming Lee
(74) *Attorney, Agent, or Firm* — Convergent Law Group LLP

(57) ABSTRACT

Exemplary embodiments provide for fabricating a field effect transistor (FET) with an interface layer for a gate stack using an O₃ post treatment. Aspects of the exemplary embodiments include: forming a semiconductor body upon a substrate; cleaning the surface of the semiconductor body; depositing a first dielectric layer on the semiconductor body; performing an O₃ treatment to form a new interface layer that incorporates material from the substrate and material from the first dielectric layer; and performing gate stack processing, including deposition of a gate electrode.

26 Claims, 2 Drawing Sheets

(56) References Cited

U.S. PATENT DOCUMENTS

| | | | |
|---|---|---|---|
| 9,099,411 B2 * | 8/2015 | Hu | H01L 21/02532 |
| 2006/0258078 A1 | 11/2006 | Lee | |
| 2011/0132449 A1 * | 6/2011 | Ramadas | H05B 33/04 |
| | | | 136/256 |
| 2011/0256682 A1 | 10/2011 | Yu | |
| 2013/0301668 A1 * | 11/2013 | Zhang | H01S 5/323 |
| | | | 372/50.1 |
| 2013/0316546 A1 | 11/2013 | Tong | |
| 2015/0091060 A1 * | 4/2015 | Yang | H01L 29/66431 |
| | | | 257/194 |

* cited by examiner

INTERFACE LAYER FOR GATE STACK USING $O_3$ POST TREATMENT

CROSS-REFERENCE TO RELATED APPLICATIONS

This application claims the benefit of priority of provisional Patent Application Ser. No. 62/034,900 filed on Aug. 8, 2014, and assigned to the assignee of the present application and herein incorporated by reference.

BACKGROUND

Gate stacks for high mobility channel MOS devices need to be developed to match the good characteristics obtained for silicon (Si) channel devices MOS devices used in previous nodes. This, however, has proven difficult. Requirements for providing gate stacks for high mobility channel MOS devices may include: a thin scaled equivalent oxide thickness (EOT), high mobility, low interface defect density (Dit), low gate leakage, and the like. Specifically for high Germanium (Ge) SiGe nMOS devices (e.g. Ge content larger than about 80%) or Ge nMOS devices, it is very difficult to achieve all these requirements.

BRIEF SUMMARY

Exemplary embodiments provide for fabricating a field effect transistor (FET) with an interface layer for a gate stack using an $O_3$ post treatment. Aspects of the exemplary embodiments include: forming a semiconductor body upon a substrate; cleaning the surface of the semiconductor body; depositing a first dielectric layer on the semiconductor body; performing an $O_3$ treatment to form a new interface layer that incorporates material from the substrate and material from the first dielectric layer; and performing gate stack processing, including deposition of a gate electrode.

BRIEF DESCRIPTION OF SEVERAL VIEWS OF THE DRAWINGS

These and/or other features and utilities of the present general inventive concept will become apparent and more readily appreciated from the following description of the embodiments, taken in conjunction with the accompanying drawings of which.

DETAILED DESCRIPTION

Figure 1:
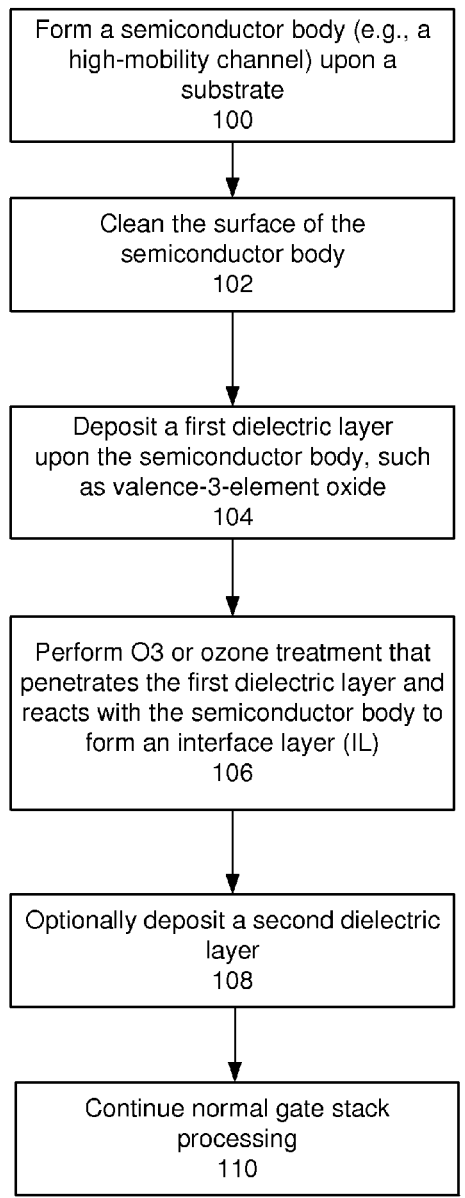
FIG. 1 is a flow diagram illustrating a process for fabricating a field effect transistor (FET) with an interface layer for a gate stack using an O3 post treatment according to one example embodiment.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Advantages and features of the present invention and methods of accomplishing the same may be understood more readily by reference to the following detailed description of embodiments and the accompanying drawings. The present general inventive concept may, however, be embodied in many different forms and should not be construed as being limited to the embodiments set forth herein. Rather, these embodiments are provided so that this disclosure will be thorough and complete and will fully convey the concept of the general inventive concept to those skilled in the art, and the present general inventive concept will only be defined by the appended claims. In the drawings, the thickness of layers and regions are exaggerated for clarity.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The exemplary embodiments provide a process to fabricate gate stacks on high mobility channel materials, such as high Ge SiGe (Ge>80%) channels, by growing an interface layer (IL) using an O3 post-treatment.

FIG. 1 is a flow diagram illustrating a process for fabricating a field effect transistor (FET) with an interface layer for a gate stack using an O3 post treatment according to one example embodiment. The process may begin by forming a semiconductor body upon a substrate using well-known processing steps, in which normally the gate dielectric module starts, including cleans, etc. (block 100). In one embodiment, the semiconductor body may comprise a high-mobility channel material.

Figure 2:
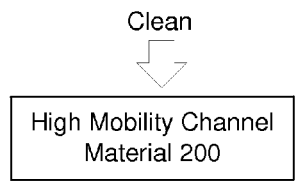
FIG. 2 is a diagram graphically illustrating a cleaning process performed on the surface of a semiconductor body, such as a high mobility semiconductor.

Next, a surface of the semiconductor body is cleaned (block 102). Cleaning the surface of the high mobility semiconductor can be accomplished by methods known in the art, such as wet (e.g. HF and/or HCl solutions) or in-situ cleans. FIG. 2 is a diagram graphically illustrating a cleaning process performed on the surface of a semiconductor body, such as a high mobility semiconductor 200.

Referring again to FIG. 1, following the cleaning, a first dielectric layer is deposited upon a semiconductor body, such as a valence-3-element oxide material (block 104). In one embodiment, the examples of the valence-3-element oxide may include Al2O3$_2$, Sc$_2$O$_3$, Y$_2$O$_3$, or other rare earth oxides. According to the exemplary embodiment, this first dielectric layer is referred to as the "first high-k" layer. Note, valence-3-metal oxides are chosen for the first dielectric layer since they result in superior gate stack properties as compared to the use of other oxides as first dielectric layers. For example, the use of HfO$_2$ as first dielectric layer may diminish the quality of gate stacks on high-mobility semiconductor such as Ge. In one embodiment, the first dielectric layer may be deposited thinly, e.g., a thickness of up to 1 nm, and more particularly 0.2 to 1 nm. The high-k layer is preferably deposited directly on a clean surface of the semiconductor body without a pre-existing interface layer (IL).

Figure 3:
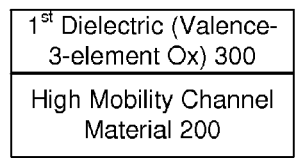
FIG. 3 is a diagram illustrating the first dielectric layer deposited on the surface of the high mobility channel material.

FIG. 3 is a diagram illustrating the first dielectric layer 300 deposited on the surface of the high mobility channel material 200. The deposition of the first dielectric layer 300 may be carried out by processes such as Atomic Layer Deposition (ALD). In one embodiment, an ALD process, such as Trimethyl Aluminum (TMA) for the case of Al$_2$O$_3$, is preferably selected that grows the valence-3-element oxide without using O3 as the oxidant because it is too oxidizing. Instead, H2O is preferably used as the oxidant during the ALD process to prevent IL growth during this step.

Figure 4:
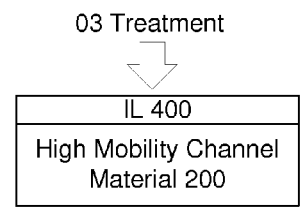
FIG. 4 is a block diagram graphically illustrating implementation of the post high-k layer O3 treatment to form/grow the IL.

Referring again to FIG. 1, after the thin layer of the first dielectric or high-k layer is deposited, an O$_3$ (or Ozone) treatment is performed that mixes with and penetrates the first dielectric layer and reacts with the substrate of the semiconductor body to form a new interface layer (IL) (block 106). FIG. 4 is a block diagram graphically illustrating implementation of the post high-k layer O$_3$ treatment to form/grow the IL 400. The new IL 400 formed by this process incorporates material from the substrate and (all the) material from the first dielectric layer 300 (i.e., the first high-k layer). The resulting IL 400 may be a homogenous layer (i.e. a homogenous mixture or compound of substrate material, valence-3 metal and oxygen), may have a graded or non-uniform composition or may be substantially a bi-layer (i.e. with substantially a substrate material oxide in the lower portion and substantially a valence-3-metal oxide on top).

In one embodiment, the O$_3$ treatment is performed in-situ, which means that the process step is performed subsequently to the previous process step without an exposure to an ambient (air) in between. This is done to prevent, for example, moisture effects on the films. In an alternative embodiment, an ex-situ O$_3$ treatment process can be used when a material comprising the first dielectric layer is resistant to moisture from the ambient (such as Al$_2$O$_3$).

In one embodiment, the O$_3$ treatment may be performed at elevated temperatures and using less than 1 nm layer of valence-3-element oxide of the high-k layer so that the IL 400 grows and changes below the high-k layer, rather than the top of the high-k layer. Stated differently, a thin 0.2 to 1 nm high-k layer is designed to allow the post O$_3$ treatment to penetrate through the high-k layer, modify the valence-3-element oxide and to oxidize the high mobility channel material and grow the IL for improved gate stack properties. In addition, plasma treatment is not required for this step.

According to the exemplary embodiment when the substrate is a high Ge SiGe alloy or Ge, the IL may comprise GeO2 that has improved properties. In some embodiments, the IL may contain a mixed Ge-valence-3-element oxide, where the valence-3 element was originally present in the first high-k layer. O3 treatment conditions can be devised by those with ordinary skill in the art, in order to optimize the properties of the IL and gate stack. In one embodiment, the O3 treatment may include flowing an O3 pulse for 2-60 seconds within the ALD reactor at a wafer temperature range of 150-450 C. In one embodiment, the pulse duration may vary from a few seconds to approximately one minute. Typical O3 concentrations used in O3 generators used typically in ALD reactors are acceptable for this application. This process can achieve improved characteristics for MOS devices, including thin EOT (equivalent oxide thickness) and low leakage and Dit (density of interface traps).

Referring again to FIG. 1, in one embodiment, the process may further include depositing an optional second dielectric layer on the IL (block 108). In one embodiment, the second dielectric layer may comprise a second high-k dielectric layer having a layer thickness of 0.5 nm to 10 nm.

Figure 5:
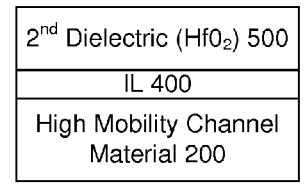
FIG. 5 is a diagram graphically illustrating the second dielectric layer deposited over the IL.

FIG. 5 is a diagram graphically illustrating the second dielectric layer 500 deposited over the IL 400. In one embodiment, the high-k material of the second dielectric layer has a dielectric constant greater than 3.9. An example of such a high-k material is HfO2 for instance. More particularly, the second dielectric layer may comprise a material selected from the group consisting of hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate, or combinations therein.

Figure 6:
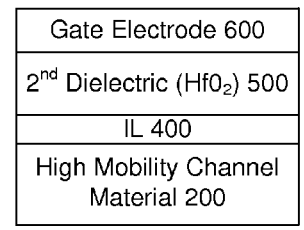
FIG. 6 is a block diagram illustrating the gate stack, including the gate electrode.

Referring again to FIG. 1, after the second dielectric layer 500 is deposited, normal gate stack processing is performed, including deposition of a gate electrode on the second dielectric layer (block 110). FIG. 6 is a block diagram illustrating the gate stack, including the gate electrode 600.

The exemplary embodiments described herein include novel features over conventional processing techniques, including the following: 1) the treatment post high-k deposition is O$_3$ based rather than a conventional plasma based process. The plasma process may be detrimental to the MOS devices. 2) The O$_3$ treatment is performed after the first high-k deposition. This is in contrast to simply growing a GeO$_2$ layer using O$_3$ without the presence of the high-k layer. The process described in the exemplary embodiments results in improved EOT control, and final quality of the gate stack. 3) The process described in the exemplary embodiments is different in that conventional processes may use PVD co-deposition to grow a doped GeO$_2$, which cannot be used for 3D structures like FinFETs or nanowires. In contrast, the process described in the exemplary embodiments can be applied to any MOS device, including FinFET and nanowires. In addition, given the different approaches to generate the IL, the IL obtained can be quite different. Also, as described above, the exemplary embodiment allow for much improved control of EOT at sub-nm EOTs than a process with direct O$_3$ treatment of the high mobility material (without the first high-k layer present).

Figure 7:
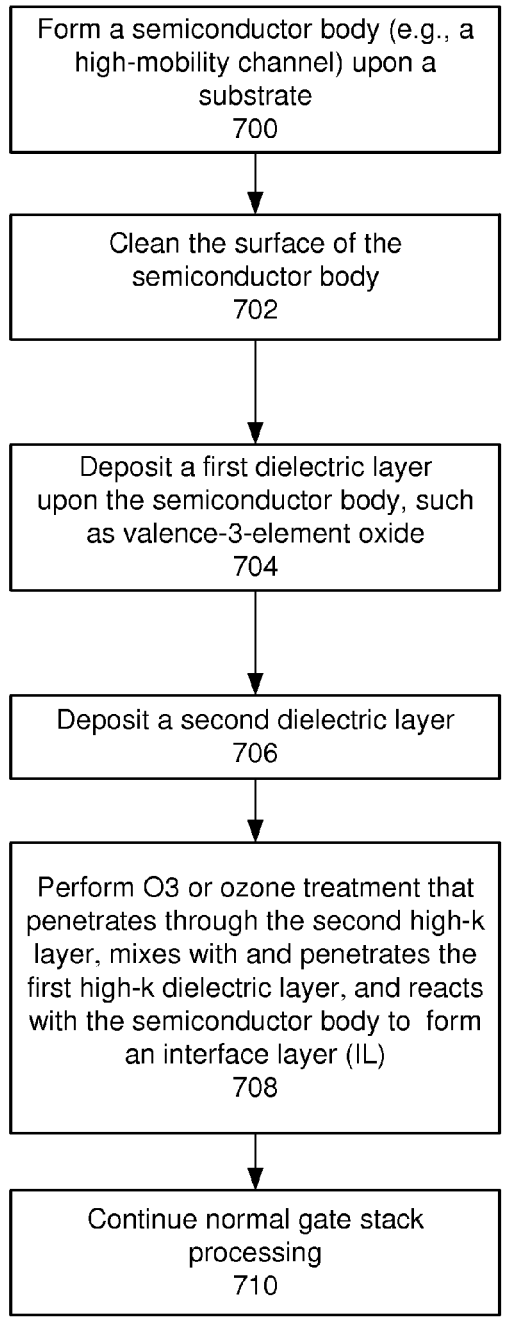
FIG. 7 is a flow diagram illustrating a process for fabricating an FET with an interface layer for a gate stack using an O3 post treatment according to an alternative embodiment.

FIG. 7 is a flow diagram illustrating a process for fabricating an FET with an interface layer for a gate stack using an O$_3$ post treatment according to an alternative embodiment. The process is similar to the process shown in FIG. 1, except the order of the O$_3$ post treatment and deposition of the second high-k dielectric layer are switched such that the second high-k dielectric layer is deposited prior to the O$_3$ post treatment.

The process may begin by forming a semiconductor body upon a substrate using well-known processing steps, in which normally the gate dielectric module starts, including cleans, etc. (block 700). In one embodiment, the semiconductor body may comprise a high-mobility channel material.

Next, a surface the semiconductor body is cleaned (block 702). Cleaning the surface of the high mobility semiconductor can be accomplished by methods known in the art, such as wet (e.g. HF and/or HCL) or in-situ cleans.

Following the cleaning, a first dielectric layer is deposited upon a semiconductor body, such as a valence-3 element oxide material (block 704). In one embodiment, the examples of the valence-3-element oxide may include $Al_2O_3$, $Sc_2O_3$, $Y_2O_3$, or other rare earth oxides. According to the exemplary embodiment, this first dielectric layer is referred to as the "first high-k" layer. In one embodiment, the first dielectric layer may be deposited thinly, e.g., a thickness of up to 1 nm, and more particularly 0.2 to 1 nm. The high-k layer is preferably deposited directly on a clean surface of the semiconductor body without a pre-existing interface layer (IL).

The deposition of the first dielectric layer 300 may be carried out by processes such as Atomic Layer Deposition (ALD). In one embodiment, an ALD process, such as Trimethyl Aluminum (TMA) for the case of $Al_2O_3$, is preferably selected that grows the valence-3-element oxide without using O3 as the oxidant because it is too oxidizing. Instead H2O is preferably used as the oxidant during the ALD process to prevent IL growth during this step.

The process further includes depositing an optional second dielectric layer (block 706). In one embodiment, the second dielectric layer may comprise a second high-k dielectric layer having a layer thickness of 0.5 nm to 3 nm. In one embodiment, the high-k material of second dielectric layer has a dielectric constant greater than 3.9. An example of such a high-k material is $HfO_2$ for instance.

After the second first dielectric or high-k layer is deposited, an $O_3$ treatment is performed that penetrates through the second high-k layer, mixes with and penetrates the first high-k dielectric layer, and reacts with the semiconductor body to form a new interface layer (IL) (block 708).

In one embodiment, the $O_3$ treatment is performed in-situ, which means that the process step is performed subsequently to the previous process step without an exposure to an ambient (air) in between. This is done to prevent, for example, moisture effects on the films. In an alternative embodiment, an ex-situ $O_3$ treatment process can be used when a material comprising the second dielectric layer is resistant to moisture from the ambient.

In one embodiment, the $O_3$ treatment may be in the form of an $O_3$ pulse performed within the ALD reactor, at similar temperatures as used for the first high-k deposition. Typical temperatures may range from 150-450° C. In one embodiment, the pulse duration may vary from a few seconds to approximately one minute. Typical $O_3$ concentrations used in $O_3$ generators used typically in ALD reactors are acceptable for this application. This process can achieve improved characteristics for MOS devices, including thin EOT (equivalent oxide thickness) and low leakage and Dit (density of interface traps).

After the $O_3$ treatment is performed, normal gate stack processing is performed, including deposition of a gate electrode on the interface layer (block 710).

Figure 8:
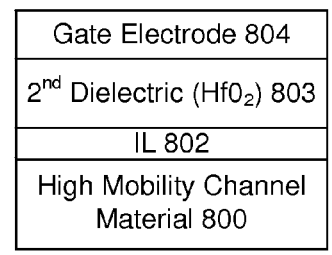
FIG. 8 is a block diagram illustrating the gate stack created using the process described in FIG. 7.

FIG. 8 is a block diagram illustrating the gate stack created using the process described in FIG. 7. As shown, application of an $O_3$ treatment to previously deposited first and second dielectric layers on a semiconductor body, such as a high mobility channel material 800, forms an IL 802 generally below the second high-k dielectric 803 on which at least one gate electrode 804 has been placed.

A method and system for fabricating a field effect transistor with an interface layer for a gate stack using an $O_3$ post treatment has been disclosed. The present invention has been described in accordance with the embodiments shown, and there could be variations to the embodiments, and any variations would be within the spirit and scope of the present invention. For example, the exemplary embodiment can be implemented using hardware, software, a computer readable medium containing program instructions, or a combination thereof. Software written according to the present invention is to be either stored in some form of computer-readable medium such as a memory, a hard disk, or a CD/DVD-ROM and is to be executed by a processor. Accordingly, many modifications may be made by one of ordinary skill in the art without departing from the spirit and scope of the appended claims.

We claim:

1. A method for fabricating a field effect transistor (FET) comprising:
   forming a semiconductor body upon a substrate;
   cleaning the surface of the semiconductor body;
   depositing a first dielectric layer on the semiconductor body;
   performing an $O_3$ treatment to form a $GeO_2$ interface layer that incorporates material from the substrate and material from the first dielectric layer; and
   performing gate stack processing, including deposition of a gate electrode.

2. The method of claim 1, wherein the first dielectric layer comprises a valence-3-element oxide material, $Al_2O_3$, $Sc_2O_3$, $Y_2O_3$, or a rare earth oxide.

3. The method of claim 2, wherein the first dielectric layer is deposited directly on a clean surface of the semiconductor body without a pre-existing interface layer.

4. The method of claim 1, wherein the first dielectric layer is deposited to a thickness of up to 1 nm.

5. The method of claim 1, wherein performing an $O_3$ treatment further comprises: performing the $O_3$ treatment in-situ without exposure to an ambient.

6. The method of claim 1, wherein performing an $O_3$ treatment further comprises: performing the $O_3$ treatment ex-situ when a material comprising the first dielectric layer is resistant to moisture.

7. The method of claim 1, wherein depositing a first dielectric layer on the semiconductor body further comprises: depositing the first dielectric layer using Atomic Layer Deposition (ALD) without using $O_3$ as an oxidant.

8. The method of claim 7, wherein performing an $O_3$ treatment further comprises: performing the $O_3$ treatment by flowing an $O_3$ pulse of 2-60 seconds within the ALD at a wafer temperature in a range of 150-450° C.

9. The method of claim 8, further comprising: performing the $O_3$ treatment by flowing an $O_3$ pulse of 2-60 seconds within a reactor used to deposit the first dielectric layer at a wafer temperature in the 150-450° C. range.

10. The method of claim 1, further comprising: after the $O_3$ treatment, depositing a second dielectric layer on the $GeO_2$ interface layer and forming the gate stack over the second dielectric layer.

11. The method of claim 10, wherein the second dielectric layer is deposited to a thickness of 0.5 nm to 10 nm.

12. The method of claim 10, wherein the second dielectric layer has a dielectric constant greater than 3.9.

13. The method of claim 1, further comprising: depositing a second dielectric layer on the first dielectric layer; and then performing the $O_3$ treatment on the second dielectric layer to form the $GeO_2$ interface layer.

14. A field effect transistor (FET), comprising:
   a semiconductor body formed upon a substrate;
   a $GeO_2$ interface layer deposited upon the semiconductor body, the $GeO_2$ interface layer formed by applying an $O_3$ post treatment to a first dielectric layer deposited on the semiconductor body; and
   a gate stack, including a first gate electrode, formed over the $GeO_2$ interface layer.

15. The FET of claim 14, wherein the first dielectric layer comprises a valence-3 element oxide material, comprising at least one of $Al_2O_3$, $Sc_2O_3$, $Y_2O_3$ and a rare earth oxide.

16. The FET of claim 14, wherein the first dielectric layer is deposited to a thickness of up to 1 nm.

17. The FET of claim 16, wherein the first dielectric layer is deposited directly on a clean surface of the semiconductor body without a pre-existing interface layer.

18. The FET of claim 14, wherein the $O_3$ post treatment is performed in-situ without exposure to an ambient.

19. The FET of claim 14, wherein the $O_3$ post treatment is performed ex-situ when a material comprising the first dielectric layer is resistant to moisture.

20. The FET of claim 14, wherein the $O_3$ post treatment is performed using Atomic Layer Deposition (ALD) without using $O_3$ as an oxidant.

21. The FET of claim 14, wherein the $GeO_2$ interface layer comprises $GeO_2$.

22. The FET of claim 14, wherein a second dielectric layer is deposited on the $GeO_2$ interface layer and the gate stack is formed over the second dielectric layer.

23. The FET of claim 22, wherein the second dielectric layer is deposited to a thickness of 0.5 nm to 10 nm.

24. The FET of claim 22, wherein the second dielectric layer has a dielectric constant greater than 3.9.

25. The FET of claim 14, wherein a second dielectric layer is deposited on the first dielectric layer; and the $GeO_2$ interface layer is formed by applying an $O_3$ post treatment to a second dielectric layer.

26. A method for fabricating a field effect transistor (FET) comprising:
   forming a semiconductor body upon a substrate;
   cleaning the surface of the semiconductor body;
   depositing a first dielectric layer on the semiconductor body;
   depositing a second dielectric layer on the first dielectric layer;
   performing an $O_3$ treatment to form a $GeO_2$ interface layer that incorporates material from the substrate and material from the first dielectric layer; and
   performing gate stack processing, including deposition of a gate electrode.

* * * * *